US009640282B1

(12) United States Patent
Chen et al.

(10) Patent No.: US 9,640,282 B1
(45) Date of Patent: May 2, 2017

(54) FLEXIBLE I/O PARTITION OF MULTI-DIE MEMORY SOLUTION

(71) Applicant: Invensas Corporation, San Jose, CA (US)

(72) Inventors: Yong Chen, Palo Alto, CA (US); Zhuowen Sun, Campbell, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/980,189

(22) Filed: Dec. 28, 2015

(51) Int. Cl.
*G11C 29/00* (2006.01)
*G11C 29/56* (2006.01)
*G11C 29/12* (2006.01)

(52) U.S. Cl.
CPC ...... *G11C 29/56* (2013.01); *G11C 2029/1206* (2013.01); *G11C 2229/743* (2013.01)

(58) Field of Classification Search
CPC .................................................. G11C 29/56
USPC ............ 365/51, 201, 230.03, 230.04, 230.13
See application file for complete search history.

(56) References Cited

U.S. PATENT DOCUMENTS

| | | | | |
|---|---|---|---|---|
| 7,898,884 B2* | 3/2011 | Dono | ............... | G01R 31/31723 365/201 |
| 8,411,521 B2* | 4/2013 | LaBerge | ............... | G11C 7/1051 365/193 |
| 2006/0087900 A1* | 4/2006 | Bucksch | ............ | G11C 29/1201 365/201 |

* cited by examiner

*Primary Examiner* — Tha-O H Bui
(74) *Attorney, Agent, or Firm* — Lerner, David, Littenberg, Krumholz & Mentlik, LLP

(57) ABSTRACT

A method of testing a microelectronic package configured to provide memory access can include energizing terminals of the microelectronic package, the terminals including first terminals configured to carry address information and second terminals configured to carry data signals. The method can also include applying read and write test data signals simultaneously to the first and second sets of second terminals, so as to simultaneously test read and write operation in first and second microelectronic elements of the microelectronic package. The first and second microelectronic elements can be configured to provide access to memory storage array locations in the first and second microelectronic elements. The terminals can also include third terminals configured to receive a test mode input that reconfigures the first and second microelectronic elements to permit simultaneous access to memory storage array locations in the first and second microelectronic elements.

20 Claims, 7 Drawing Sheets

FIG. 2E

| | | | |
|---|---|---|---|
| Vddq | NC | | |
| Vss | DQ0_0 | | |
| Vddq | DQ1_0 | | |
| Vss | DQS_0 | | |
| ZQ_0 | Vss | | |
| NC | NC | | |
| NC | NC | | |
| VREFDQ_0 | Vdd | | |
| Vdd | Vss | | |
| VREFCA_0 | Vdd | | |
| Vss | Vss | | |
| Vdd | Vdd | | |
| Vss | RTSB_0 | | |

| Vddq | DM_0 |
|---|---|
| Vss | DQ2_0 |
| Vddq | DQ3_0 |
| Vss | DQSB_0 |
| ZQ_0 | Vddq |
| NC | Vss |
| NC | ODT_0 |
| VREFDQ_0 | CKE_0 |
| Vdd | CSB_0 |
| VREFCA_0 | Vss |
| Vss | Vdd |
| Vdd | Vss |
| Vss | Vdd |

| Vdd | Vdd |
|---|---|
| RASB | CASB |
| A10 | WEB |
| CK | CKB |
| A15 | BA2 |
| BA0 | A12 |
| BA1 | A0 |
| A3 | A12 |
| A4 | A2 |
| A5 | A11 |
| A6 | A9 |
| A7 | A14 |
| A8 | A13 |

| NC | DM_1 | Vddq |
|---|---|---|
| DQ2_1 | DQ0_1 | Vss |
| DQ3_1 | DQ1_1 | Vddq |
| DQS_1 | DQSB_1 | Vss |
| Vss | Vddq | ZQ_1 |
| NC | Vss | NC |
| NC | ODT_1 | NC |
| Vdd | CKE_1 | VREFDQ_1 |
| Vss | CSB_1 | Vdd |
| Vdd | Vss | VREFCA_1 |
| Vss | Vdd | Vss |
| Vdd | Vss | Vdd |
| RTSB_1 | Vdd | Vss |

FLEXIBLE I/O PARTITION OF MULTI-DIE MEMORY SOLUTION

BACKGROUND OF THE INVENTION

The subject matter of the present application relates to microelectronic packages, circuit panels, and microelectronic assemblies incorporating one or more microelectronic package and a circuit panel.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory, and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device.

Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., that extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or may include a DRAM chip, or a stacked electrically interconnected assembly of such semiconductor chips.

For example, in one conventional microelectronic package 1 seen in FIG. 1A, columns of terminals 2 can be disposed adjacent edges of a package substrate 3. FIG. 1A further shows two semiconductor chips 4 within the package having element contacts 5 on a face 6 thereof that are electrically interconnected with the terminals 2 of the package 1 through flip-chip connections, for example.

FIG. 1B shows the electrical connections within the conventional microelectronic package 1. In the microelectronic package 1, several of the terminals 2 that are configured to receive command and address signals are electrically connected to the element contacts 5 of both of the semiconductor chips 4. For example, each of the terminals 2 configured to receive address signals A0 through A14 are electrically connected with a corresponding element contact 5 of both of the semiconductor chips 4. Also in the microelectronic package 1, several of the terminals 2 that are configured to receive data signals are electrically connected to the element contacts 5 of both of the semiconductor chips 4. For example, each of the terminals 2 configured to receive data signals DQ0 through DQ3 are electrically connected with a corresponding element contact 5 of both of the semiconductor chips 4.

In light of the foregoing, certain improvements in the design of circuit panels or other microelectronic components can be made in order to improve the functional flexibility or electrical performance thereof, particularly in circuit panels or other microelectronic components to which packages can be mounted and electrically interconnected with one another.

BRIEF SUMMARY OF THE INVENTION

A method of testing a microelectronic package configured to provide memory access can include energizing terminals of the microelectronic package, the microelectronic package having first and second microelectronic elements each having memory storage array function and configured to provide access to memory storage array locations in the first and second microelectronic elements. The terminals can include a plurality of first terminals configured to carry address information, a plurality of second terminals configured to carry data signals, and one or more third terminals configured to receive a test mode input that reconfigures the first and second microelectronic elements to permit simultaneous access to memory storage array locations in the first and second microelectronic elements. The energizing can include applying the test mode input to the one or more third terminals.

The second terminals can include a first set of second terminals electrically coupled to the first microelectronic element and not to the second microelectronic element, and a second set of second terminals electrically coupled to the second microelectronic element and not to the first microelectronic element. The method can also include, while the test mode input is active, applying read and write test data signals simultaneously to the first and second sets of second terminals, so as to simultaneously test read and write operation in each of the first and second microelectronic elements.

In one embodiment, the read and write test data signals can be sent to data input element contacts of the first and second microelectronic elements. In a particular example, the data input element contacts can consist of a first set of four data input element contacts of the first microelectronic element and a second set of four data input element contacts of the second microelectronic element. In an exemplary embodiment, the read and write test data signals can be first test signals. The method can also include sending a plurality of second test signals simultaneously to address input element contacts of the first and second microelectronic elements, the second test signals being sent via the first terminals. In one example, each of the microelectronic elements can embody a greater number of active devices to provide memory storage array function than any other function.

In a particular embodiment, each of the microelectronic elements can be of type DDRx. In one embodiment, at least some of the first terminals can be configured to carry command signals transferred to the microelectronic package, the command signals being write enable, row address strobe, and column address strobe signals. In a particular example, the method can also include, before the energizing, electrically connecting the terminals of the microelectronic package with panel contacts of a test circuit panel. The method can also include after the energizing, disconnecting the terminals of the microelectronic package from the panel contacts of the circuit panel.

In an exemplary embodiment, the microelectronic package can a first microelectronic package, the test mode input can a first test mode input, and the read and write test data signals can first read and write test data signals. The method can also include after the disconnecting, electrically connecting terminals of a second microelectronic package to the panel contacts of the test circuit panel. The method can also include sending a second test mode input from the circuit panel to third terminals of the second microelectronic package, and sending second read and write test data signals simultaneously to first and second sets of second terminals of the second microelectronic package.

A microelectronic package configured to provide memory access can include a substrate having first and second opposed surfaces each extending in first and second transverse directions. The substrate can have terminals at the second surface configured for electrical connection with corresponding panel contacts of a test circuit panel external to the microelectronic package. The microelectronic package can also include first and second microelectronic elements each having memory storage array function and configured to provide access to memory storage array locations in the first and second microelectronic elements. The microelectronic elements can each have a surface facing the first surface of the substrate. Each microelectronic element can have element contacts electrically connected with the terminals.

The terminals can include a plurality of first terminals configured to carry address information, a plurality of second terminals configured to carry data signals, and one or more third terminals configured to receive a test mode input that reconfigures the first and second microelectronic elements to permit simultaneous access to memory storage array locations in the first and second microelectronic elements. Each of the third terminals can be electrically coupled to a corresponding one of the microelectronic elements. The second terminals can include a first set of second terminals electrically coupled to the first microelectronic element and not to the second microelectronic element, and a second set of second terminals electrically coupled to the second microelectronic element and not to the first microelectronic element. The first and second sets of second terminals can be configured to simultaneously receive read and write test data signals from the panel contacts of the test circuit panel.

In one embodiment, the second terminals can be electrically coupled to data input element contacts of the first and second microelectronic elements. In a particular example, the data input element contacts can consist of a first set of four data input element contacts of the first microelectronic element and a second set of four data input element contacts of the second microelectronic element. In an exemplary embodiment, at least some of the first terminals can be electrically coupled to address input element contacts of each of the first and second microelectronic elements. In one example, each of the microelectronic elements can embody a greater number of active devices to provide memory storage array function than any other function.

In a particular embodiment, each of the microelectronic elements can be of type DDRx. In one embodiment, at least some of the first terminals can be configured to carry command signals transferred to the microelectronic package, the command signals being write enable, row address strobe, and column address strobe signals. In a particular example, a microelectronic assembly can include the microelectronic package as described above. The microelectronic assembly can also include the test circuit panel. The terminals of the microelectronic package can be electrically connected with the corresponding panel contacts of the test circuit panel.

In an exemplary embodiment, the test circuit panel can have a data bus comprising a plurality of signal conductors. The signal conductors can be electrically coupled to data input element contacts of each of the first and second microelectronic elements. The data input element contacts of each of the first and second microelectronic elements can be configured to simultaneously receive the read and write test data signals from the signal conductors. In one example, a system can include the microelectronic package as described above and one or more other electronic components electrically connected to the microelectronic package. In a particular embodiment, the system can also include a housing, the microelectronic package and the one or more other electronic components being assembled with the housing.

BRIEF DESCRIPTION OF THE DRAWINGS

FIG. 2E is a potential diagrammatic top plan view of the circuit panel shown in FIG. 2A, according to the embodiment of FIG. 2B, with the circuit panel configured in a product mode.

DETAILED DESCRIPTION

Figure 1A:
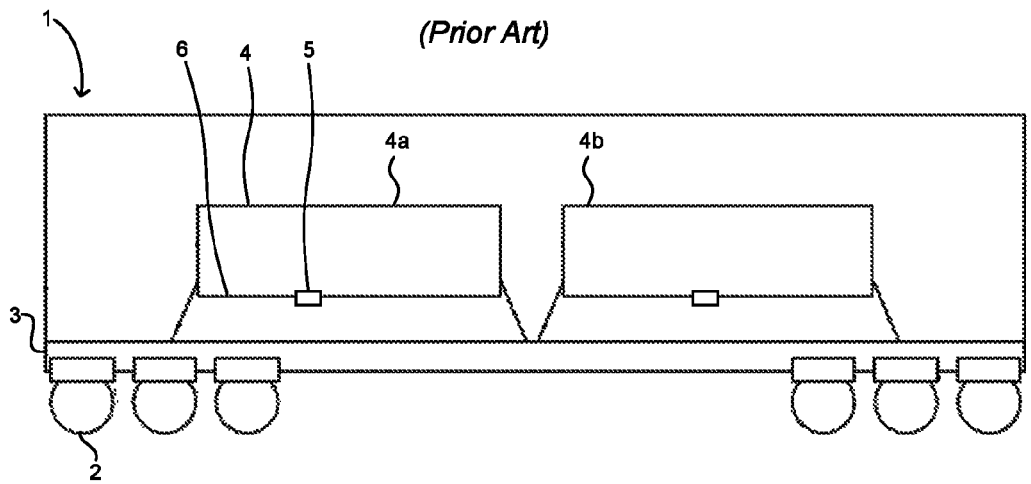
FIG. 1A is a side sectional view of a prior art microelectronic package.
Figure 1B:
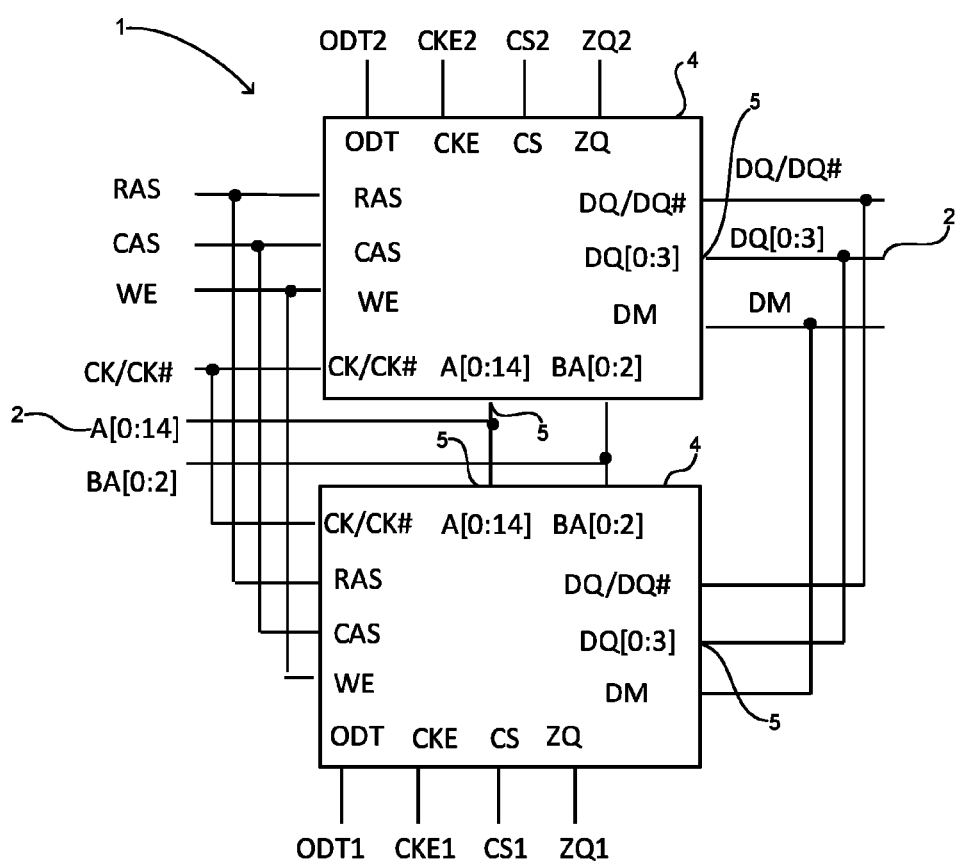
FIG. 1B is a diagrammatic representation of the electrical connections within the microelectronic package shown in FIG. 1A.

In view of the illustrative conventional microelectronic package 1 described relative to FIGS. 1A and 1B, the inventors have recognized improvements which can be made that may help improve testing of electrical performance of a microelectronic package incorporating two or more memory storage array chips.

Figure 2A:
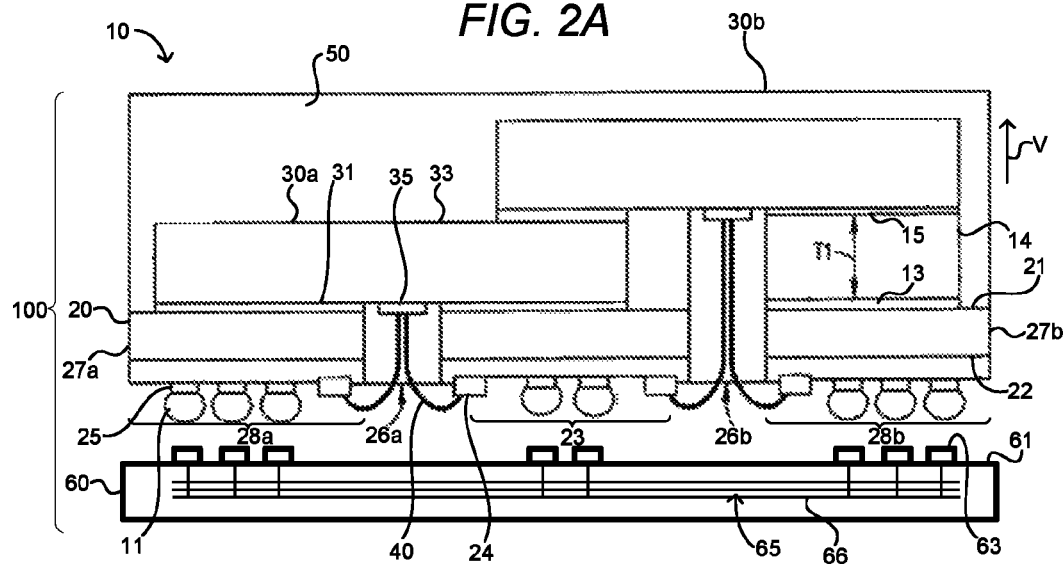
FIG. 2A is a side sectional view of a microelectronic assembly including a microelectronic package and a circuit panel according to an embodiment of the present invention.
Figure 2B:
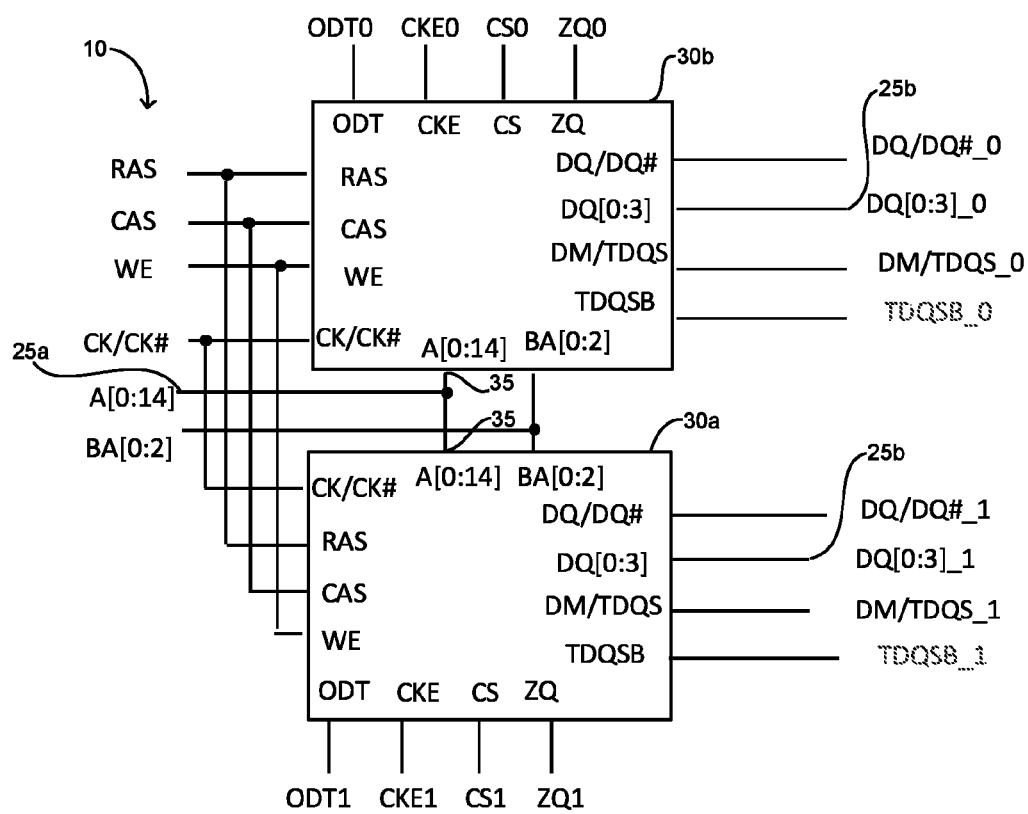
FIG. 2B is a potential diagrammatic representation of the electrical connections within the microelectronic package shown in FIG. 2A, according to one embodiment.
Figure 2C:
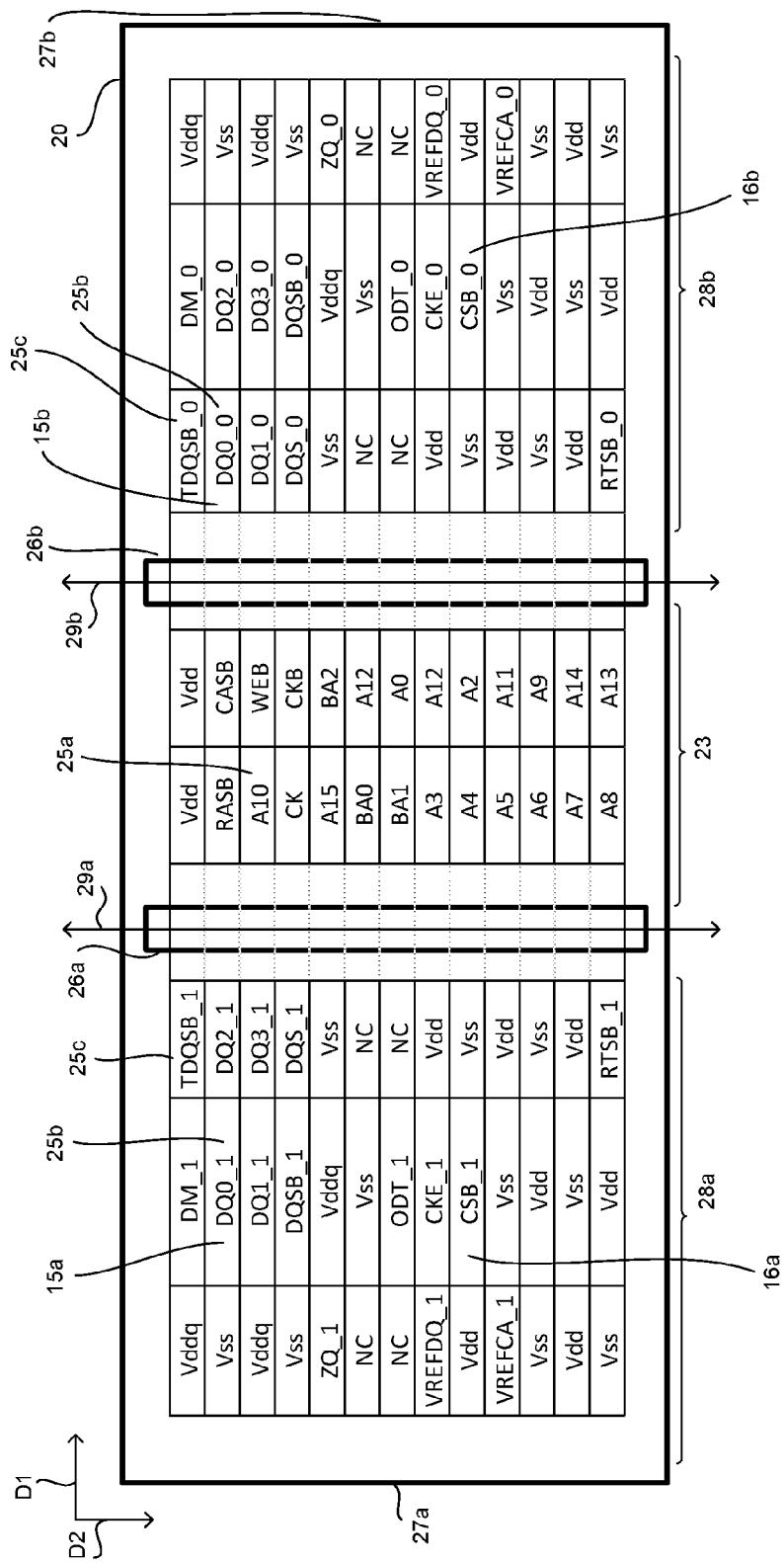
FIG. 2C is a potential diagrammatic bottom plan view of the microelectronic package shown in FIG. 2A, according to the embodiment of FIG. 2B.

FIGS. 2A-2C illustrate a particular type of microelectronic package 10. As seen in FIGS. 2A-2C, the microelectronic package 10 can include packaging structure, for example, a dielectric element or substrate 20, e.g., a support element that includes or consists essentially of dielectric material, e.g., organic or inorganic dielectric material such as, without limitation, oxides, nitrides, or combinations thereof, epoxies, polyimides, thermoset materials or thermoplastics, or other polymeric materials, or composite materials such as epoxy-glass, which can be FR-4 or BT resin structures, or which can be a portion of a tape utilized in tape-automated bonding ("TAB"), for example. The dielectric element 20 has first and second oppositely facing surfaces 21 and 22. Each of the first and second surfaces 21, 22 can extend in first and second transverse directions D1, D2.

In some cases, the dielectric element 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the dielectric element, i.e., in a direction along its surface.

In FIGS. 2A-2C, the directions parallel to the first surface 21 of the dielectric element 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

First and second apertures 26a, 26b can extend between the first and second surfaces 21, 22 of the dielectric element 20. As can be seen in FIG. 2A, the dielectric element 20 can have two apertures 26a and 26b extending therethrough. The longest dimensions of the apertures 26a and 26b can define first and second parallel axes 29a and 29b (FIG. 2C). The first and second parallel axes 29a and 29b can define a central region 23 of the second surface 22 of the dielectric element 20 located between the axes 29a and 29b. A first peripheral region 28a of the second surface is disposed between axis 29a and the peripheral edge 27a of the dielectric element. A second peripheral region 28b of the second surface is disposed between axis 29b and a peripheral edge 27b of the dielectric element opposite from peripheral edge 27a. Hereinafter, a statement that a terminal is disposed between an aperture of a substrate and a given feature of a substrate or package such as a peripheral edge thereof shall mean that the terminal is disposed between an axis of the aperture and the given feature.

The dielectric element 20 can have a plurality of terminals 25, e.g., conductive pads, lands, or conductive posts at the second surface 22 of the dielectric element 20. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

The terminals 25 can be configured for electrical connection of the microelectronic package 10 with corresponding electrically conductive elements (shown as panel contacts 63) at a first surface 61 of an external component such as the contacts of a circuit panel 60, e.g., test circuit panel, printed wiring board, flexible circuit panel, socket, other microelectronic assembly or package, interposer, or passive component assembly, among others. In one example, such a circuit panel can be a motherboard or DIMM module board. In a particular example, the circuit panel 60 can include an element having a CTE less than 30 ppm/° C. In one embodiment, such an element can consist essentially of semiconductor, glass, ceramic or liquid crystal polymer material.

A microelectronic assembly 100 shown in FIG. 2A can include the microelectronic package 10 and the circuit panel 60 such as a test circuit panel or an operating circuit panel. The terminals 25 of the microelectronic package 10 can be electrically connected with corresponding panel contacts 63 of the circuit panel 60. The circuit panel 60 can have a data bus 65 comprising a plurality of signal conductors 66, the signal conductors being electrically coupled to data input element contacts 35 of each of the first and second microelectronic elements 30a, 30b. The data input element contacts 35 of each of the first and second microelectronic elements 30a, 30b can be configured to simultaneously receive read and write test data signals from the signal conductors 66, as will be described in more detail below.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials. In a particular embodiment, the joints between the terminals 25 and contacts of an external component (e.g., the circuit panel 60) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or can be formed in a manner as described therein.

The microelectronic package 10 can comprise a plurality of microelectronic elements 30 each having a front face 31 facing the first surface 21 of the dielectric element 20. In one example, the microelectronic elements 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In one example, each of the microelectronic elements 30 can have memory storage array function. In a particular embodiment, each microelectronic element 30 can embody a greater number of active devices to provide memory storage array function than any other function.

Figure 5:
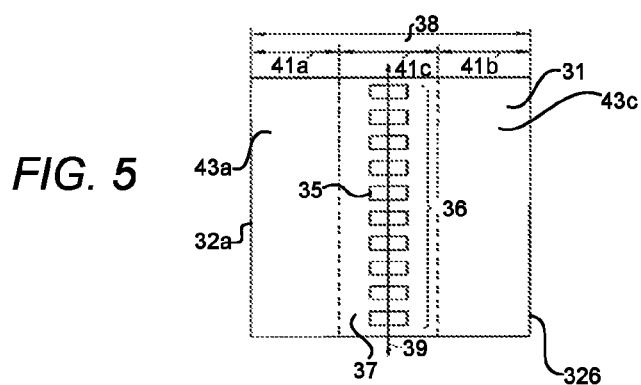
FIG. 5 is a bottom plan view of one of the microelectronic elements shown in FIG. 2A.

As further seen in FIG. 2A, each microelectronic element 30 can have a plurality of electrically conductive element contacts 35 exposed at the front surface 31 thereof. The contacts 35 of each microelectronic element 30 can be arranged in one (FIG. 5) or in two or more (not shown) columns 36 disposed in a central region 37 of the front face 31 that occupies a central portion of an area of the front face. As used herein with respect to a face (e.g., a front face, a rear face) of a microelectronic element, "central region" means an area, such as region 37, occupying a middle third 41c of a distance 38 between opposite peripheral edges 32a, 32b of the microelectronic element 30 in a direction orthogonal to the edges 32a, 32b.

The central region 37 is disposed between peripheral regions 43a, and 43b, each of which lies between the central region 37 and a respective peripheral edge 32a or 32b, and each peripheral region also occupying an area covering a respective third 41a or 41b of the distance 38 between the opposite peripheral edges 32a, 32b. In the particular example shown in FIG. 5, when the contacts 35 of each microelectronic element 30 are arranged in a central region 37 of the microelectronic element, the contacts can be arranged along an axis 39 that bisects the microelectronic element. As shown in FIG. 2A, the contacts 35 of each microelectronic element 30 can be aligned with at least one of the apertures 26. In one example, the contacts of microelectronic element 30a can be aligned only with one of the apertures 26 and the contacts of microelectronic element 30b can be aligned only with the other one of the apertures 26.

The microelectronic elements 30 in a microelectronic package 10 can be configured in accordance with one of several different standards, e.g., standards of JEDEC, which specify the type of signaling that semiconductor chips (such as the microelectronic elements 30) transmit and receive through the contacts 35 thereof.

Thus, in one example, each of the microelectronic elements 30 can be of DDRx type, i.e., configured in accordance with one of the JEDEC double data rate DRAM standards DDR3, DDR4, or one or more of their follow-on standards (collectively, "DDRx"). Each DDRx type microelectronic element can be configured to sample the command and address information coupled to the contacts thereof at a first sampling rate, such as once per clock cycle (e.g., on the rising edge of the clock cycle). In particular examples, the DDRx type microelectronic elements can have four, eight or sixteen contacts used for transmitting and receiving bi-directional data signals, each such bi-directional signal referred to as a "DQ" signal. Alternatively, the first terminals of a package can be configured to carry uni-directional data signals such as data signals or "D" signals input to the package and data signals "Q" output from the package, or can be configured to carry a combination of bi-directional and uni-directional data signals.

In another example, each of the microelectronic elements 30 can be of LPDDRx type, i.e., configured in accordance with one of the JEDEC low power double data rate DRAM standards LPDDR3 or one or more of its follow-on standards (collectively, "LPDDRx"). LPDDRx type DRAM chips are available which have 32 contacts assigned to carry DQ signals. There are other differences as well. Each contact 35 on a LPDDRx type DRAM chip may be used to simultaneously carry two different signals in interleaved fashion. For example, each contact 35 on such DRAM chip can be assigned to carry one signal which is sampled on the rising edge of the clock cycle and can also be assigned to carry another signal which is sampled on the falling edge of the clock cycle. Thus, in LPDDRx type chips, each microelectronic element 30a, 30b can be configured to sample the command and address information input to the contacts thereof at a second sampling rate, such as twice per clock cycle (e.g., on both the rising edge and on the falling edge of the clock cycle). Accordingly, the number of contacts on the LPDDRx DRAM chip that carry address information or command-address bus information can also be reduced.

Electrical connections between the contacts 35 and the terminals 25 can include leads, e.g., wire bonds 40, or other possible structure in which at least portions of the leads are aligned with at least one of the apertures 26. For example, as seen in FIG. 2A, at least some of the electrical connections can include a wire bond 40 that extends beyond an edge of an aperture 26 in the dielectric element 20, and is joined at one end to the contact 35 of a microelectronic element and to a conductive element 24 of the dielectric element 20 at another end. In one embodiment, at least some of the electrical connections between the dielectric element and the contacts of the microelectronic element can be through lead bonds, i.e., leads that are integral with other conductive elements on the dielectric element and which extend in a lateral direction along one or both of the first and second surfaces 21, 22 of the dielectric element 20 and are bonded to contacts of one or more of the microelectronic elements, each lead having a portion aligned with at least one of the apertures 26.

Referring again to FIG. 2A, a spacer 14 can be positioned between the front surface 31 of the second microelectronic element 30b and a portion of the first surface 21 of the dielectric element 20. Such a spacer 14 can be made, for example, from a dielectric material such as silicon dioxide, a semiconductor material such as silicon, and may include one or more layers 13, 15 of adhesive. In one embodiment, the spacer 14 can have substantially the same thickness T1 in a vertical direction V substantially perpendicular to the first surface 21 of the dielectric element 20 as the thickness T2 of the first microelectronic element 30a between the front and rear surfaces 31, 33 thereof. In addition, the one or more adhesive layers 13, 15 can be positioned between the first microelectronic element 30a and the dielectric element 20, between the first and second microelectronic elements 30a and 30b, between the second microelectronic element 30b and the spacer 14, and between the spacer 14 and the dielectric element 20.

The microelectronic package 10 can also include an encapsulant 50 that can optionally cover, partially cover, or leave uncovered the rear surfaces 33 of the microelectronic elements 30. For example, in the microelectronic package 10 shown in FIG. 1A, an encapsulant can be flowed, stenciled, screened or dispensed onto the rear surfaces 33 of the microelectronic elements 30. The microelectronic package 10 can further include an encapsulant (not shown) that can optionally cover the wire bonds 40 and the conductive elements 24 of the dielectric element 20. Such an encapsulant can also optionally extend into the apertures 26, and it can cover the contacts 35 of the microelectronic elements 30.

In one example, as can be seen in FIG. 2C, terminals 25 that are disposed in the central region 23 of the second surface 22 of the dielectric element 20 can be configured to carry address signals. These terminals are referred to herein as "first terminals." The first terminals 25a comprise terminals configured to carry address information. For example, when the microelectronic elements 30a, 30b include or are DRAM semiconductor chips, each group of first terminals 25a can be configured to carry sufficient address information transferred to the microelectronic package 10 that is usable by circuitry within the package, e.g., row address and column address decoders, and bank selection circuitry of one or more of the microelectronic elements 30 to determine an addressable memory location from among all the available addressable memory locations of a memory storage array within a microelectronic element in the package.

In a particular embodiment, the first terminals 25a can be configured to carry all the address information used by such circuitry within the microelectronic package 10 to determine an addressable memory location within such memory storage array. Although in the embodiments shown, all of the first terminals 25a configured to carry address information are disposed in the central region 23, that need not be the case. In some embodiments, some or all of the first terminals 25a may be disposed outside of the central region 23, such as in the first peripheral region 28a and/or in the second peripheral region 28b of the second surface 22.

In the embodiment of FIGS. 2A-2C, at least some signals that pass through the first terminals 25a of the package can be common to both of the microelectronic elements 30a, 30b. These signals can be routed through connections such as conductive traces extending on or within the dielectric element 20 in directions parallel to the first and second surfaces 21, 22 of the dielectric element from the terminals 25 to the corresponding contacts 35 of the microelectronic elements 30. For example, a first terminal 25a configured to carry address information (e.g., A0-A14) disposed in the central region 23 of the second surface 22 of the dielectric element 20 can be electrically coupled with a conductive contact 35 of each microelectronic element 30 through a conductive trace, a conductive element 24, e.g., a bond pad, and a wire bond 40 joined to the conductive element 24 and the contact 35.

For example, as can be seen in FIG. 2B, in the microelectronic package 10, several of the first terminals 25a that are configured to receive command and address signals are electrically connected to the element contacts 35 of both of the microelectronic elements 30a, 30b. For example, each of the terminals 25a configured to receive address signals A0 through A14 are electrically connected with a corresponding element contact 35 of both of the microelectronic elements 30a, 30b. In one example, each of the first terminals 25a that is configured to receive a particular address signal A0 through A14 is electrically connected to a corresponding element contact 35 of both of the microelectronic elements 30a, 30b that is configured to receive address information having the same "numerical weight." For example, an address can be specified by 15 address bits A0 . . . A14. Each bit has a numerical weight, from the highest-ordered address information bit A14, which has a numerical weight of 14 representing 2^14 (2 to the power of 14), to the lowest-ordered address information bit A0, which has a numerical weight of zero representing 2^0 (2 to the power of zero), which is the 1's place of the address.

In one example, at least some of the first terminals 25a can be configured to carry command signals transferred to the microelectronic package 10. The first terminals 25a can be configured to carry each of a group of signals of a command-address bus of the microelectronic element; i.e., command signals, address signals, bank address signals, and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

As further seen in FIG. 2C, in addition to first terminals 25a, groups of second terminals 25b can be disposed in first peripheral region 28a and in second peripheral region 28b of the second surface, respectively. In one example, the second terminals 25b can be configured to carry one or more of data strobe signals, or other signals or reference potentials such as chip select, reset, power supply voltages, e.g., Vdd, Vddq, and ground, e.g., Vss and Vssq. The second terminals 25b may include terminals assigned to carry data signals and also data masks and "on die termination" (ODT) signals used to turn on or off parallel terminations to termination resistors.

Typically, the second terminals 25b are configured to carry all bi-directional data signals for writing of data to and for reading of data from random access addressable locations of at least a main memory storage array within each DRAM microelectronic element. However, in some cases, some of the second terminals can carry uni-directional data signals for input to a microelectronic element for writing of data to a memory storage array, and some of the first terminals can carry uni-directional data signals output from a microelectronic element based on data read from a memory storage array.

In one example, the second terminals 25b can include a first set 15a of second terminals 25b electrically coupled to the first microelectronic element 30a and not to the second microelectronic element 30b, and a second set 15b of second terminals electrically coupled to the second microelectronic element and not to the first microelectronic element. For example, the first set 15a of second terminals 25b can include the terminals assigned to carry signals DQ0-DQ3 to the first microelectronic element 30a, and the second set 15b of second terminals 25b can include the terminals assigned to carry signals DQ0-DQ3 to the second microelectronic element 30b.

In one example, second terminals 25b that are disposed in the central region 23 of the second surface 22 of the dielectric element 20 can be configured to carry one or more of data strobe signals, or other signals or reference potentials such as chip select, reset, power supply voltages, e.g., Vdd, Vddq, and ground, e.g., Vss and Vssq. The second terminals 25b may include terminals assigned to carry data signals and also data masks and "on die termination" (ODT) signals used to turn on or off parallel terminations to termination resistors. Although in the embodiments shown, all of the second terminals 25b configured to carry data signals are disposed in the first peripheral region 28a and/or in the second peripheral region 28b, that need not be the case. In some embodiments, some or all of the second terminals 25b may be disposed outside of the first and second peripheral regions 28a, 28b, such as in the central region 23 of the second surface 22. In a particular example, all of the second terminals 25b configured to carry data signals can be disposed in only the first peripheral region 28a or only in the second peripheral region 28b.

In operation, the microelectronic package 10 is configured to provide memory access, in which memory storage arrays of the first and second microelectronic elements 30a, 30b can collectively function to provide access to at least one rank of memory. Each rank is a portion of the memory storage arrays of the microelectronic package 10 that shares the same address and data buses and are selected via chip select (CS) terminals. For example, the microelectronic package 10 can include chip select terminals 16a, 16b, which can be configured to permit access to either the first set 15a of second terminals 25b or the second set 15b of second terminals, but not both sets simultaneously. The microelectronic package 10 can be configured to provide sequential access to memory storage array locations in the first and second microelectronic elements 30a, 30b.

In different implementations, the same microelectronic package 10 can be configured to provide either single or dual rank operation. In one embodiment, the microelectronic package 10 can be configured to provide single rank operation, with a dual memory width, providing simultaneous access to the four DQ element contacts of both of the first and second microelectronic elements 30a, 30b. This can be done by electronically connecting together the chip select terminals 16a and 16b, using the signal conductors 66 in the circuit panel 60, for example. In another embodiment, the microelectronic package 10 can be configured to provide dual rank operation, which only permits sequential access to the four DQ element contacts of the first microelectronic element 30a or the second microelectronic element 30b. This can be done by electronically connecting together the terminals assigned to carry signals DQ0-DQ3 to the first microelectronic element 30a with the terminals assigned to carry signals DQ0-DQ3 to the second microelectronic element 30b, using the signal conductors 66 in the circuit panel 60, for example.

In the example shown in FIG. 2C, a first rank of memory can be accessed via four DQ element contacts of the first microelectronic element 30a, which are electrically connected to the first set 15a of second terminals 25b (includes DQ0_1 through DQ3_1), and a second rank of memory can be accessed via four DQ element contacts of the second microelectronic element 30a, which are electrically connected to the second set 15b of second terminals 25b (includes DQ0_0 through DQ3_0). The first terminals 25a that are configured to carry address information can be electrically connected to element contacts 35 of both of the first and second microelectronic elements 30a, 30b, and those first terminals can be shared for accessing the DQ element contacts of each of the microelectronic elements.

As further seen in FIG. 2C, in addition to first and second terminals 25a, 25b, third terminals 25c (termination data strobes) can be disposed in the first peripheral region 28a and in the second peripheral region 28b of the second surface, respectively. Each of the third terminals 25c can be electrically coupled to a corresponding one of the microelectronic elements 30a, 30b. In one example, the third terminals 25c (TDQSB_1, TDQSB_0) can be configured to receive a test mode input that reconfigures the first and second microelectronic elements 30a, 30b to permit simultaneous access to memory storage array locations in the first and second microelectronic elements. Such simultaneous access can be beneficial, since it can permit testing time to be cut in half, compared to testing the conventional dual-die package of FIGS. 1A and 1B.

Although in FIG. 2C, the third terminals 25c are disposed in the peripheral regions 28a, 28b, in some examples, the third terminals can be located anywhere on the second surface 22 of the substrate 20, such as in the central region 23. In one embodiment, one of the third terminals 25c can be disposed in one of the peripheral regions 28a, 28b, and another of the third terminals can be disposed in the central region 23. In a particular example, both of the third terminals 25c can be disposed in the central region 23.

For example, a traditional testing sequence for a conventional microelectronic package 1 shown in FIGS. 1A and 1B can include four sequential steps, which first performs tests for one die, and then the other die: (1) test the command and address (CA) terminals connected to the first microelectronic element 4a; (2) test the data (DQ) terminals connected to the first microelectronic element; (3) test the CA terminals connected to the second microelectronic element 4b; and (4) test the DQ terminals connected to the second microelectronic element.

An improved testing sequence for the microelectronic package 10 shown in FIGS. 2A-2C can reduce such testing to two sequential steps, which is done for both dies simultaneously: (1) test the CA terminals 25a connected to both the first and second microelectronic elements 30a, 30b; and (2) test the DQ terminals 25b connected to both the first and second microelectronic elements. This improved testing sequence can permit testing time to be reduced by approximately 50% compared to the traditional testing sequence described above, which may provide significant manufacturing cost savings.

To permit simultaneous access for testing, a user can energize the terminals 25 of the microelectronic package 10, the energizing including applying a test mode input to one or more of the third terminals 25c (e.g., from a test circuit panel 60). While the test mode input is active, a user can apply read and write test data signals simultaneously to the first and second sets 15a, 15b of second terminals 25b, so as to simultaneously test read and write operation in each of the first and second microelectronic elements 30a, 30b. While the test mode input is active, a user can apply read and write test data signals simultaneously to all of the bits of a storage location of each rank of memory access in the microelectronic package 10.

Therefore, the microelectronic package 10 can be configured to permit a user to selectively toggle the microelectronic package between an operational mode configured to provide sequential access to memory storage array locations in the first or second microelectronic elements 30a, 30b, and a test mode configured to provide simultaneous access to memory storage array locations in the first and second microelectronic elements. This ability of the microelectronic package 10 can allow simultaneous testing of both of the first and second microelectronic elements 30a, 30b in a test mode, even though when the microelectronic package is in its normal operating mode, only one rank of memory storage array locations may be accessed at any single time. Also in some operational mode embodiments, as described above, the microelectronic package 10 can be configured to permit simultaneous access to memory storage array locations in the first and second microelectronic elements 30a, 30b.

For example, in a normal operating mode, the microelectronic package 10 can be configured to provide two ranks of 4-bit memory access, in which 4 DQ contacts 35 of the first microelectronic element 30a are coupled to the first set 15a of the second terminals 25b assigned to carry four bi-directional data signals DQ0 . . . DQ3, and 4 DQ contacts of the second microelectronic element 30b are coupled to the second set 15b of the second terminals 25b assigned to carry four other bi-directional data signals DQ0 . . . DQ3. In normal operating mode, either the first set 15a of second terminals 25b or the second set 15b of second terminals can be accessed at any single time, but not both sets simultaneously.

In test mode, while the test mode input is active, eight bi-directional data signals can be transferred in tandem on the eight DQ terminals 25b to 4 DQ contacts 35 of the first microelectronic element 30a and 4 DQ contacts of the second microelectronic element 30b, to support the simultaneous 8-bit memory access for testing purposes. Specifically, in test mode, eight bi-directional data signals can be received simultaneously, i.e., on the same clock cycle, by the 4 DQ element contacts 35 of the first microelectronic element 30a and the 4 DQ element contacts of the second microelectronic element 30b through the eight DQ terminals 25b, and eight bi-directional data signals can be output simultaneously, on the same clock cycle, by the first and second microelectronic elements through the eight DQ terminals.

In the example shown in FIG. 2C, at least some of the first terminals 25a can be electrically coupled to address input element contacts 35 of each of the first and second microelectronic elements 30a, 30b. In test mode of the microelectronic package 10, while the test mode input is active, address information can be sent simultaneously, via the first terminals 25a, to address input element contacts 35 of the first and second microelectronic elements 30a, 30b.

To permit simultaneous access for testing, a user can applying a test mode input to one or more of the third terminals 25c. A test circuit panel 60 can be used to provide the test mode input, and to energize the terminals 25. Before energizing the terminals 25, the microelectronic package 10 can be temporarily electrically connected with the panel contacts 63 of the test circuit panel 60. After the energizing of the terminals 25, the terminals can be disconnected from the panel contacts 63.

The same test circuit panel 60 can be used to test a plurality of microelectronic packages 10, either sequentially or simultaneously. In one example, a first test mode input can be sent from the circuit panel 60 to the third terminals 25c of a first microelectronic package 10, and read and write test data signals can be sent simultaneously to the first and second sets 15a, 15b of second terminals 25b. After testing of the first microelectronic package 10 is completed, the first microelectronic package can be removed from the circuit panel 60, and a second microelectronic package can be electrically connected with the panel contacts 63 of the circuit panel. Then, a second test mode input can be sent from the circuit panel 60 to the third terminals 25c of a second microelectronic package 10, and read and write test data signals can be sent simultaneously to the first and second sets 15a, 15b of second terminals 25b of the second microelectronic package.

Figure 2D:
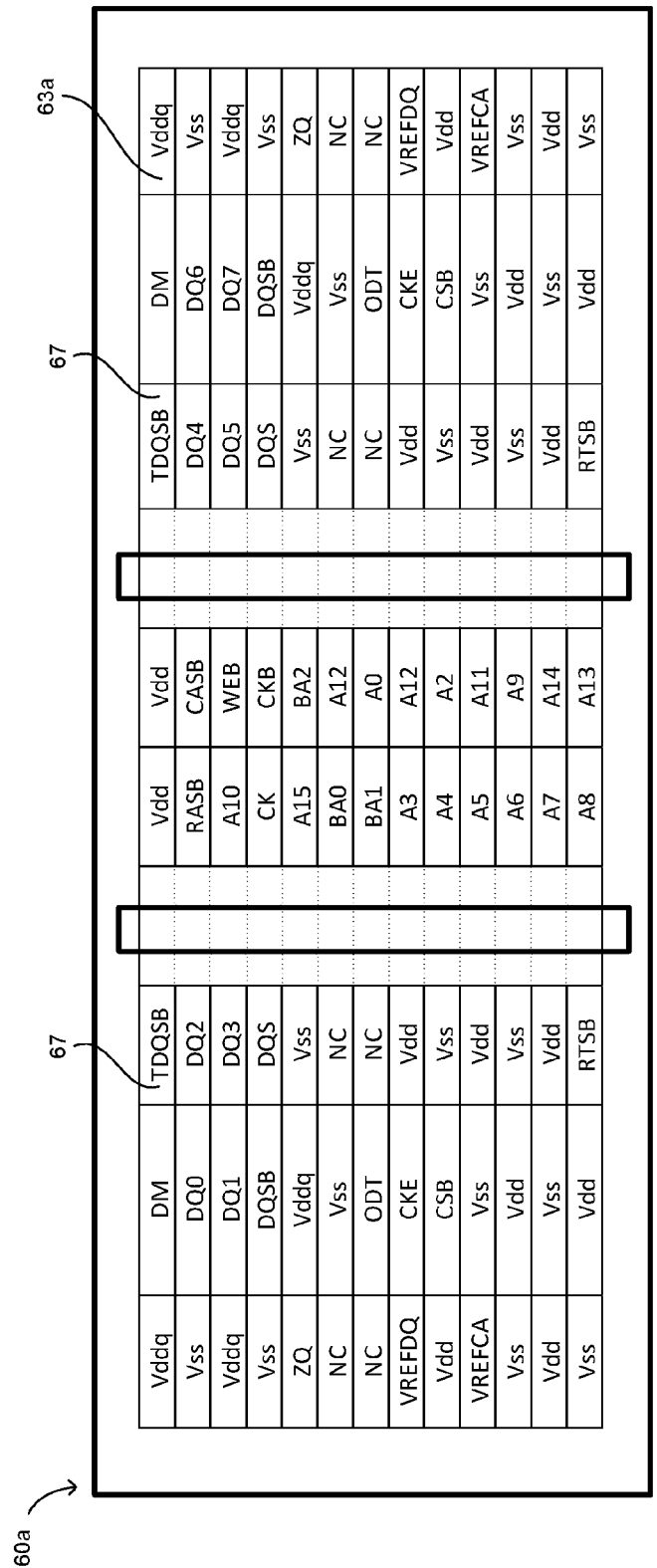
FIG. 2D is a potential diagrammatic top plan view of the circuit panel shown in FIG. 2A, according to the embodiment of FIG. 2B, with the circuit panel configured in a test mode.

FIG. 2D shows a test mode configuration of a test circuit panel 60a, which is one example of the circuit panel 60 of FIG. 2A that can be joined with the microelectronic package 10. As can be seen in FIG. 2D, the panel contacts 63a that are configured to be joined with the first and second sets 15a, 15b of second terminals 25b of the microelectronic package 10 include panel contacts labeled DQ0 . . . DQ7, which indicates that eight bi-directional data signals can be output simultaneously, on the same clock cycle, to all eight DQ terminals 25b of the microelectronic package (each set 15a, 15b of DQ terminals 25b being labeled DQ0 . . . DQ3). FIG. 2D also has two panel contacts 67 labeled TDQSB (termination data strobe) that are configured to be joined with the third terminals 25c.

FIG. 2E shows an operating or product mode configuration of a product circuit panel 60b, which is another example of the circuit panel 60 of FIG. 2A that can be joined with the microelectronic package 10. As can be seen in FIG. 2E, the panel contacts 63b that are configured to be joined with the first and second sets 15a, 15b of second terminals 25b of the microelectronic package 10 include two sets of panel contacts labeled DQ0 . . . DQ3.

When the microelectronic package 10 is electrically connected to the product circuit panel 60b in an operating mode, the microelectronic package 10 may be configured to permit access to either the first set 15a of second terminals 25b or the second set 15b of second terminals 25b, but not both sets simultaneously. In operating mode, the microelectronic package 10 can be configured to provide sequential access to memory storage array locations in the first or second microelectronic elements 30a, 30b. In a particular operating mode embodiment, the microelectronic package 10 can alternatively be configured to provide simultaneous access to memory storage array locations in the first and second microelectronic elements 30a, 30b, as described above.

FIG. 2E does not have any panel contacts 63b labeled TDQSB. Instead, the panel contacts 63b of the product circuit panel 60b has no-connect panel contacts 68 (labeled "NC"), which are configured to be joined with the third terminals 25c, since the third terminals are not needed when the microelectronic package 10 is used in operating or product mode with a product circuit panel 60b. As used herein, a "no-connect contact" (68) of a circuit panel such as the circuit panel 60b means a contact that is not configured to carry a signal, and such a no-connect contact is electrically insulated from the other panel contacts 63b within the circuit panel 60b that are configured to carry signals.

Figure 3:
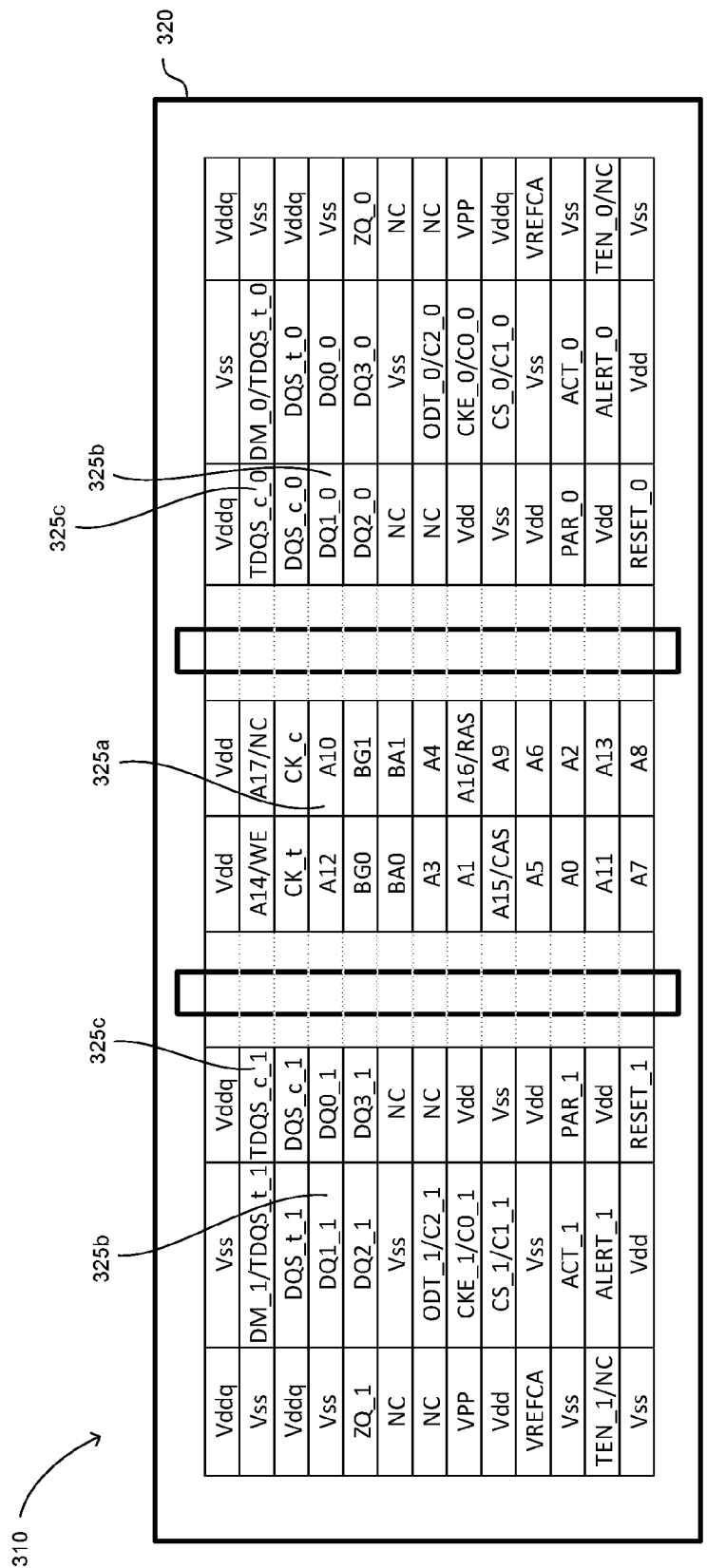
FIG. 3 is another potential diagrammatic representation of the electrical connections within the microelectronic package shown in FIG. 2A, according to another embodiment.

FIG. 3 illustrates a microelectronic package 310 that is a variation of the microelectronic package 10 of FIGS. 2A-2C. Each feature or element of the microelectronic package 310 can be the same as a corresponding feature or element of the microelectronic package 10, except as otherwise described below. The microelectronic package 310 shows a ballmap of terminals 325 that is configured to be electrically connected with two microelectronic elements of type DDR4.

Although many of the particular first terminals 325$a$, second terminals 325$b$, and third terminals 325$c$ are disposed in different locations on the substrate 320 compared to the microelectronic package 10 of FIG. 2C, the first, second, and third terminals of the microelectronic package 310 are configured to have the same function as the first, second, and third terminals of the microelectronic package 10 described above. Specifically, like the microelectronic package 10, the microelectronic package 310 can be configured to permit a user to selectively toggle the microelectronic package between an operational mode configured to provide sequential access to memory storage array locations in the first and second microelectronic elements (one set of DQ0 . . . DQ3 per clock cycle), and a test mode configured to provide simultaneous access to memory storage array locations in the first and second microelectronic elements (both sets of DQ0 . . . DQ3 in the same clock cycle). In a particular operating mode embodiment of the microelectronic package 310, the microelectronic package can alternatively be configured to provide simultaneous access to memory storage array locations in the first and second microelectronic elements, as described above.

Figure 4A:
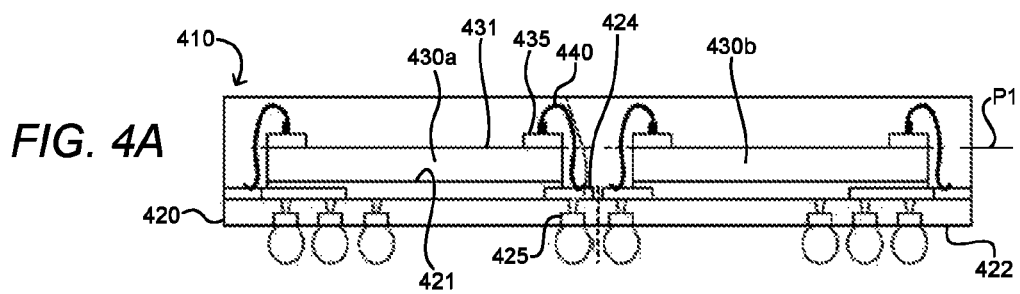
FIG. 4A is a side sectional view of a microelectronic package having a configuration of microelectronic elements that is a variation of the microelectronic package shown in FIG. 2A.

Although the microelectronic elements 30 are shown in FIG. 2A as being wire bonded to contacts of the substrate with their front faces facing the first surface of the package substrate, that need not be the case. For example, referring to FIG. 4A, the microelectronic package 410 is a variation of the microelectronic package 10 described above. The microelectronic package 410 has two microelectronic elements 430$a$ and 430$b$ each bearing element contacts 435 at a front face 431 thereof, the front faces facing away from the first surface 421 of the substrate 420. The microelectronic elements 430 are each electrically connected with conductive elements of the substrate 420 by electrically conductive structure such as wire bonds 440 extending above the front face 431 between the element contacts 435 and substrate contacts 424 at the first surface 421 of the substrate. The substrate contacts 424 are electrically connected with the terminals 425 at the second surface 422 of the substrate 420. As shown in FIG. 4E, the front faces 431 of the microelectronic elements 430 can be arranged in a single plane P1 parallel to the first surface 421 of the substrate 420.

Figure 4B:
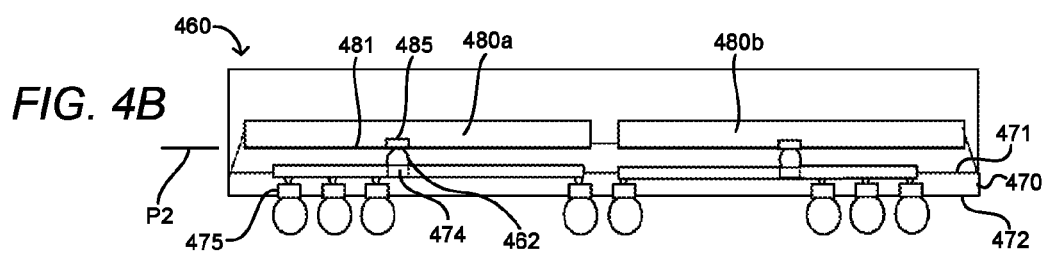
FIG. 4B is a side sectional view of a microelectronic package having a configuration of microelectronic elements that is another variation of the microelectronic package shown in FIG. 2A.

Referring to FIG. 4B, the microelectronic package 460 is another variation of the microelectronic packages 10 and 410 described above. The microelectronic package 460 has two microelectronic elements 480$a$ and 480$b$ each bearing element contacts 485 at a front face 481 thereof, the front faces facing toward the first surface 471 of the substrate 470. The element contacts 485 of the microelectronic elements 480 face and are joined to substrate contacts 474 at the first surface 471 of the substrate 470 by conductive joining material 462 extending therebetween. The substrate contacts 474 are electrically connected with the terminals 475 at the second surface 472 of the substrate 470. As shown in FIG. 4B, the front faces 481 of the microelectronic elements 480 can be arranged in a single plane P2 parallel to the first surface 471 of the substrate 470.

In another variation of the embodiment of FIG. 2A, the microelectronic elements 30$a$ and 30$b$ of FIG. 2A can be disposed adjacent to one another, with the front faces facing toward the first surface 21 of the substrate 20 and arranged in a single plane parallel to the first surface of the substrate, similar to the side-by-side arrangement of the microelectronic elements 430, 480 in FIGS. 4A and 4B. However, in this variation, similar to the embodiment of FIG. 2A, each of the microelectronic elements 30$a$ and 30$b$ can be electrically connected to substrate contacts 24 by leads (e.g., wire bonds 40) aligned with apertures 26$a$, 26$b$ extending through the substrate 20.

In yet another variation of the embodiments of FIGS. 2A, 4A, and 4B, the substrate can be omitted, such that the microelectronic package 10, 410, or 460 can be in form of microelectronic elements 30, 430, or 480 having packaging structure that includes an electrically conductive redistribution layer overlying the front face 31, 431, or 481 of one or both of the microelectronic elements. The redistribution layer has electrically conductive metallized vias extending through a dielectric layer of the package to the element contacts 35, 435, or 485 of the microelectronic elements. The redistribution layer may include the terminals 25, 425, or 485 and traces electrically connected with the terminals, such that the terminals are electrically connected with the element contacts, such as through the metallized vias or through metallized vias and electrically conductive traces. In this case, the package can be referred to as a "wafer-level package having a redistribution layer thereon." In an additional variation, such a microelectronic package having a redistribution layer thereon as described above can have one or more columns of the terminals 25, 435, or 485 disposed on areas of the dielectric layer that extend laterally beyond one or more edges of the microelectronic elements. In this case, the package 10, 410, or 460 can be referred to as a "fan-out wafer-level package having a redistribution layer thereon."

Although several of the first terminals (e.g., first terminals that are configured to carry address information) in the microelectronic packages 10 and 310 are disposed in the central region of the respective substrate, and several of the second terminals (e.g., second terminals that are configured to carry data signals) are disposed in the peripheral regions of the respective substrate, that need not be the case. In some embodiments, the first terminals can be disposed in the peripheral regions and the second terminals can be disposed in the central region. In particular examples, the first terminals and the second terminals may be distributed between the central region and the peripheral regions of the respective substrate.

Figure 6:
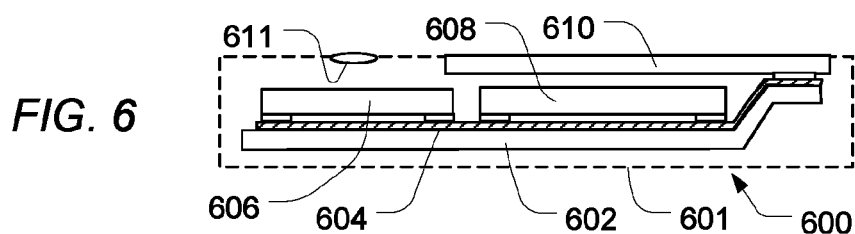
FIG. 6 is a schematic depiction of a system according to one embodiment of the invention.

The microelectronic packages, circuit panels, and microelectronic assemblies described above with reference to FIGS. 1A through 5 above can be utilized in construction of diverse electronic systems, such as the system 600 shown in FIG. 6. For example, the system 600 in accordance with a further embodiment of the invention includes a plurality of modules or components 606 such as the packages, circuit panels, and assemblies as described above, in conjunction with other electronic components 608, 610 and 611.

In the exemplary system 600 shown, the system can include a circuit panel, motherboard, or riser panel 602 such as a flexible printed circuit board, and the circuit panel can include numerous conductors 604, of which only one is depicted in FIG. 6, interconnecting the modules or components 606, 608, 610 with one another. Such a circuit panel 602 can transport signals to and from each of the microelectronic packages and/or microelectronic assemblies included in the system 600. However, this is merely exemplary; any suitable structure for making electrical connections between the modules or components 606 can be used.

In a particular embodiment, the system 600 can also include a processor such as the semiconductor chip 608, such that each module or component 606 can be configured to transfer a number N of data bits in parallel in a clock cycle, and the processor can be configured to transfer a number M of data bits in parallel in a clock cycle, M being greater than or equal to N.

In the example depicted in FIG. 6, the component 608 is a semiconductor chip and component 610 is a display screen, but any other components can be used in the system 600. Of course, although only two additional components 608 and 611 are depicted in FIG. 6 for clarity of illustration, the system 600 can include any number of such components.

Modules or components 606 and components 608 and 611 can be mounted in a common housing 601, schematically depicted in broken lines, and can be electrically interconnected with one another as necessary to form the desired circuit. The housing 601 is depicted as a portable housing of the type usable, for example, in a cellular telephone or personal digital assistant, and screen 610 can be exposed at the surface of the housing. In embodiments where a structure 606 includes a light-sensitive element such as an imaging chip, a lens 611 or other optical device also can be provided for routing light to the structure. Again, the simplified system shown in FIG. 6 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of testing a microelectronic package configured to provide memory access, comprising:
    energizing terminals of the microelectronic package, the microelectronic package having first and second microelectronic elements each having memory storage array function and configured to provide access to memory storage array locations in the first and second microelectronic elements,
        the terminals including a plurality of first terminals configured to carry address information, a plurality of second terminals configured to carry data signals, and one or more third terminals configured to receive a test mode input that reconfigures the first and second microelectronic elements to permit simultaneous access to memory storage array locations in the first and second microelectronic elements, the energizing including applying the test mode input to the one or more third terminals, and
        the second terminals including a first set of second terminals electrically coupled to the first microelectronic element and not to the second microelectronic element, and a second set of second terminals electrically coupled to the second microelectronic element and not to the first microelectronic element; and
    while the test mode input is active, applying read and write test data signals simultaneously to the first and second sets of second terminals, so as to simultaneously test read and write operation in each of the first and second microelectronic elements.

2. The method of claim 1, wherein the read and write test data signals are sent to data input element contacts of the first and second microelectronic elements.

3. The method of claim 2, wherein the data input element contacts consist of a first set of four data input element contacts of the first microelectronic element and a second set of four data input element contacts of the second microelectronic element.

4. The method of claim 1, wherein the read and write test data signals are first test signals, the method further comprising sending a plurality of second test signals simultaneously to address input element contacts of the first and second microelectronic elements, the second test signals being sent via the first terminals.

5. The method of claim 1, wherein each of the microelectronic elements embodies a greater number of active devices to provide memory storage array function than any other function.

6. The method of claim 1, wherein each of the microelectronic elements is of type DDRx.

7. The method of claim 1, wherein at least some of the first terminals are configured to carry command signals transferred to the microelectronic package, the command signals being write enable, row address strobe, and column address strobe signals.

8. The method of claim 1, further comprising:
    before the energizing, electrically connecting the terminals of the microelectronic package with panel contacts of a test circuit panel; and
    after the energizing, disconnecting the terminals of the microelectronic package from the panel contacts of the circuit panel.

9. The method of claim 8, wherein the microelectronic package is a first microelectronic package, the test mode input is a first test mode input, and the read and write test data signals are first read and write test data signals, the method further comprising:
    after the disconnecting, electrically connecting terminals of a second microelectronic package to the panel contacts of the test circuit panel;
    sending a second test mode input from the circuit panel to third terminals of the second microelectronic package; and
    sending second read and write test data signals simultaneously to first and second sets of second terminals of the second microelectronic package.

10. A microelectronic package configured to provide memory access, comprising:
    a substrate having first and second opposed surfaces each extending in first and second transverse directions, the substrate having terminals at the second surface configured for electrical connection with corresponding panel contacts of a test circuit panel external to the microelectronic package; and
    first and second microelectronic elements each having memory storage array function and configured to provide access to memory storage array locations in the first and second microelectronic elements, the microelectronic elements each having a surface facing the first surface of the substrate, each microelectronic element having element contacts electrically connected with the terminals, the terminals including a plurality of first terminals configured to carry address information, a plurality of second terminals configured to carry data signals, and one or more third terminals configured to receive a test mode input that reconfigures the first and second microelectronic elements to permit simultaneous access to memory storage array locations in the first and second microelectronic elements, each of the third terminals electrically coupled to a corresponding one of the microelectronic elements, the second terminals including a first set of second terminals electrically coupled to the first microelectronic element and not to the second microelectronic element, and a second set of second terminals electrically coupled to the second microelectronic element and not to the first microelectronic element, and the first and second sets of second terminals configured to simultaneously receive read and write test data signals from the panel contacts of the test circuit panel.

11. The microelectronic package of claim 10, wherein the second terminals are electrically coupled to data input element contacts of the first and second microelectronic elements.

12. The microelectronic package of claim 11, wherein the data input element contacts consist of a first set of four data input element contacts of the first microelectronic element and a second set of four data input element contacts of the second microelectronic element.

13. The microelectronic package of claim 10, wherein at least some of the first terminals are electrically coupled to address input element contacts of each of the first and second microelectronic elements.

14. The microelectronic package of claim 10, wherein each of the microelectronic elements embodies a greater number of active devices to provide memory storage array function than any other function.

15. The microelectronic package of claim 10, wherein each of the microelectronic elements is of type DDRx.

16. The microelectronic package of claim 10, wherein at least some of the first terminals are configured to carry command signals transferred to the microelectronic package, the command signals being write enable, row address strobe, and column address strobe signals.

17. A microelectronic assembly including the microelectronic package of claim 10, further comprising the test circuit panel, wherein the terminals of the microelectronic package are electrically connected with the corresponding panel contacts of the test circuit panel.

18. The microelectronic assembly of claim 17, wherein the test circuit panel has a data bus comprising a plurality of signal conductors, the signal conductors being electrically coupled to data input element contacts of each of the first and second microelectronic elements, the data input element contacts of each of the first and second microelectronic elements being configured to simultaneously receive the read and write test data signals from the signal conductors.

19. A system comprising the microelectronic package according to claim 10 and one or more other electronic components electrically connected to the microelectronic package.

20. The system as claimed in claim 19, further comprising a housing, the microelectronic package and the one or more other electronic components being assembled with the housing.

* * * * *